(12) United States Patent
Chen et al.

(10) Patent No.: US 10,985,618 B2
(45) Date of Patent: *Apr. 20, 2021

(54) WIRELESS TRANSMITTER WITH SWITCHABLE MODE

(71) Applicant: Taiwan Semiconductor Manufacturing Co., Ltd., Hsin-Chu (TW)

(72) Inventors: Wen-Sheng Chen, Hsin-Chu (TW);
An-Hsun Lo, Hsin-Chu (TW);
En-Hsiang Yeh, Hsin-chu (TW);
Tzu-Jin Yeh, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/666,117

(22) Filed: Oct. 28, 2019

(65) Prior Publication Data
US 2020/0067351 A1    Feb. 27, 2020

Related U.S. Application Data

(63) Continuation of application No. 15/299,053, filed on Oct. 20, 2016, now Pat. No. 10,491,046.

(51) Int. Cl.
| | |
|---|---|
| *H02J 50/23* | (2016.01) |
| *H04B 5/00* | (2006.01) |
| *H02J 50/20* | (2016.01) |

(52) U.S. Cl.
CPC ............ *H02J 50/23* (2016.02); *H02J 50/20* (2016.02); *H04B 5/0031* (2013.01); *H04B 5/0037* (2013.01)

(58) Field of Classification Search
CPC .................................. H02J 50/23; H02J 50/80
See application file for complete search history.

(56) References Cited

U.S. PATENT DOCUMENTS

| | | | |
|---|---|---|---|
| 8,279,008 B2 | 10/2012 | Hsieh et al. | |
| 8,427,240 B2 | 4/2013 | Hsieh et al. | |
| 8,593,206 B2 | 11/2013 | Chen et al. | |
| 8,610,494 B1 | 12/2013 | Jin et al. | |
| 8,618,631 B2 | 12/2013 | Jin et al. | |
| 8,912,581 B2 | 12/2014 | Lin et al. | |
| 8,941,212 B2 | 1/2015 | Yen et al. | |
| 9,184,256 B2 | 11/2015 | Huang et al. | |
| 9,209,521 B2 | 12/2015 | Hung et al. | |
| 10,491,046 B2* | 11/2019 | Chen | H04B 5/0037 |
| 2014/0132333 A1 | 5/2014 | Jin et al. | |
| 2014/0253262 A1 | 9/2014 | Hsieh et al. | |
| 2014/0253391 A1 | 9/2014 | Yen | |
| 2015/0364417 A1 | 12/2015 | Lee | |
| 2017/0005622 A1 | 1/2017 | Fitzi | |

* cited by examiner

*Primary Examiner* — Jeffrey M Shin
(74) *Attorney, Agent, or Firm* — Duane Morris LLP

(57) ABSTRACT

A wireless transmitter includes a an amplifier; and a switchable transformer, coupled to the amplifier, wherein the amplifier is configured to be coupled to the switchable transformer in first and second configurations, wherein the first configuration causes the amplifier to provide a first output impedance to the switchable transformer, and wherein the second configuration causes the amplifier to provide a second output impedance to the switchable transformer, the first and second output impedances being different from each other.

20 Claims, 6 Drawing Sheets

WIRELESS TRANSMITTER WITH SWITCHABLE MODE

CROSS-REFERENCE TO RELATED APPLICATION

This application is a continuation of U.S. patent application Ser. No. 15/299,053, filed Oct. 20, 2016, which is incorporated by reference herein in its entirety.

BACKGROUND

Bluetooth (BT) is a short-range radio standard intended to replace the cables connecting portable and fixed electronic devices. The standard, which operates in an unlicensed Industrial-Scientific-Medical ("ISM") band at 2.4 GHz, focuses on robustness, low complexity, low power, and low cost. Generally, BT is used for continuous, streaming data applications. In recent years, Bluetooth Low Energy (BLE) was proposed for the use of applications that desire even lower power consumption. Compared to a BT device (e.g., a BT transmitter) that continuously transmits data, a BLE device (e.g., a BLE transmitter) typically remains in a sleep mode constantly unless a connection to the BLE device is detected. As such, in general, a BT transmitter is designed to have a high linearity for transmitting data and accordingly consumes more power, and a BLE transmitter is designed to have a better power efficiency and accordingly consumes less power. With the ever-increasing needs in Internet of Things (IoT) and Machine to Machine (M2M) applications, optimized BT and BLE transmitters to achieve respective performance goals are equally desired.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

Due to the respective and different requirements/characteristics of the BT transmitter and BLE transmitter, as described above, a single transmitter that is desired to be used in BT and BLE applications may encounter a variety of trade-off concerns. The present disclosure provides various embodiments of a wireless transmitter that can be used in both BT and BLE applications by selectively coupling either a BT amplifier or a BLE amplifier to a switchable transformer, in accordance with some embodiments. More specifically, when the wireless transmitter is intended to be used in BT applications, the BT amplifier may be coupled to a first pair of ports of the switchable transformer so as to cause the wireless transmitter to provide a higher linearity for transmitting data; when the wireless is intended to be used in BLE applications, the BLE amplifier may be coupled to a second pair of ports of the switchable transformer so as to cause the wireless transmitter to provide a better power efficiency.

Figure 1:
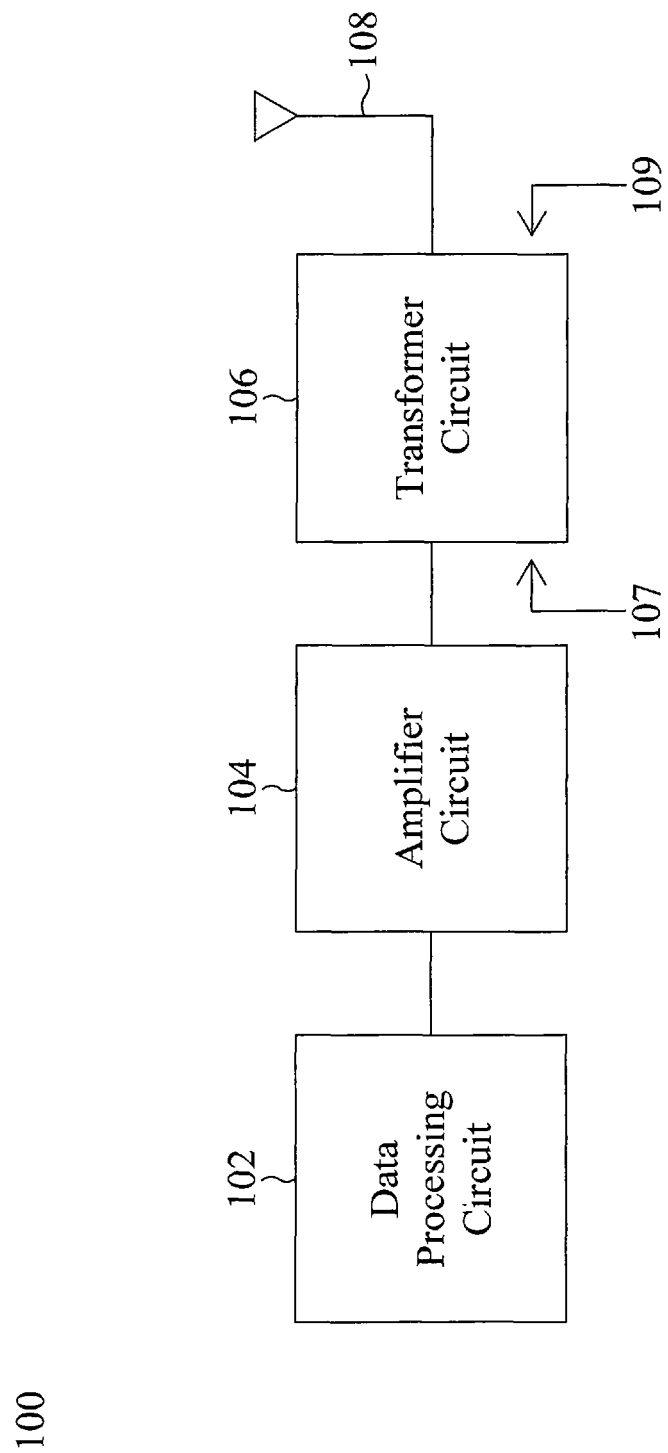
FIG. 1 illustrates an exemplary block diagram of a wireless transmitter, in accordance with some embodiments.

FIG. 1 illustrates an exemplary block diagram of a wireless transmitter 100 that can be selectively used in BT and BLE applications, in accordance with various embodiments. In general, the wireless transmitter 100 is configured to transmit data either continuously, for example, while being used in BT applications, or periodically, for example, while being used in BLE applications. Examples of a device in use for the BT applications include a wireless headset, a wireless keyboard/mouse, a wireless speaker, etc. Examples of a device in use for the BLE applications include a health condition monitor, an industrial monitoring sensor, a geography-based targeted promotion (e.g., iBeacon), etc.

More specifically, in some embodiments, the wireless transmitter 100 includes a data processing circuit 102, an amplifier circuit 104, a transformer circuit 106, and an antenna 108, wherein the above-mentioned components are serially coupled to one another, as shown in FIG. 1. In some embodiments, the data processing circuit 102 may include one or more circuits such as, for example, a baseband modulator, a digital-to-analog converter, a (low pass) filter, one or more voltage converters, a frequency synthesizer, etc. The data processing circuit 102 may be configured to generate and process data, and provide such processed data to the amplifier circuit 104. In accordance with various embodiments of the present disclosure, the amplifier circuit 104 is configured to amplify the processed data at a designated output power, and the serially coupled transformer circuit 106 is configured to match an output impedance of the amplifier circuit 104, designated by 107, to an input impedance 109 of the transformer circuit 106 so as to optimize a power transmission efficiency, as discussed in further detail below. In accordance with some embodiments, the input impedance of the transformer circuit 106 is typically about 50 ohm ($\Omega$).

Figure 3A:
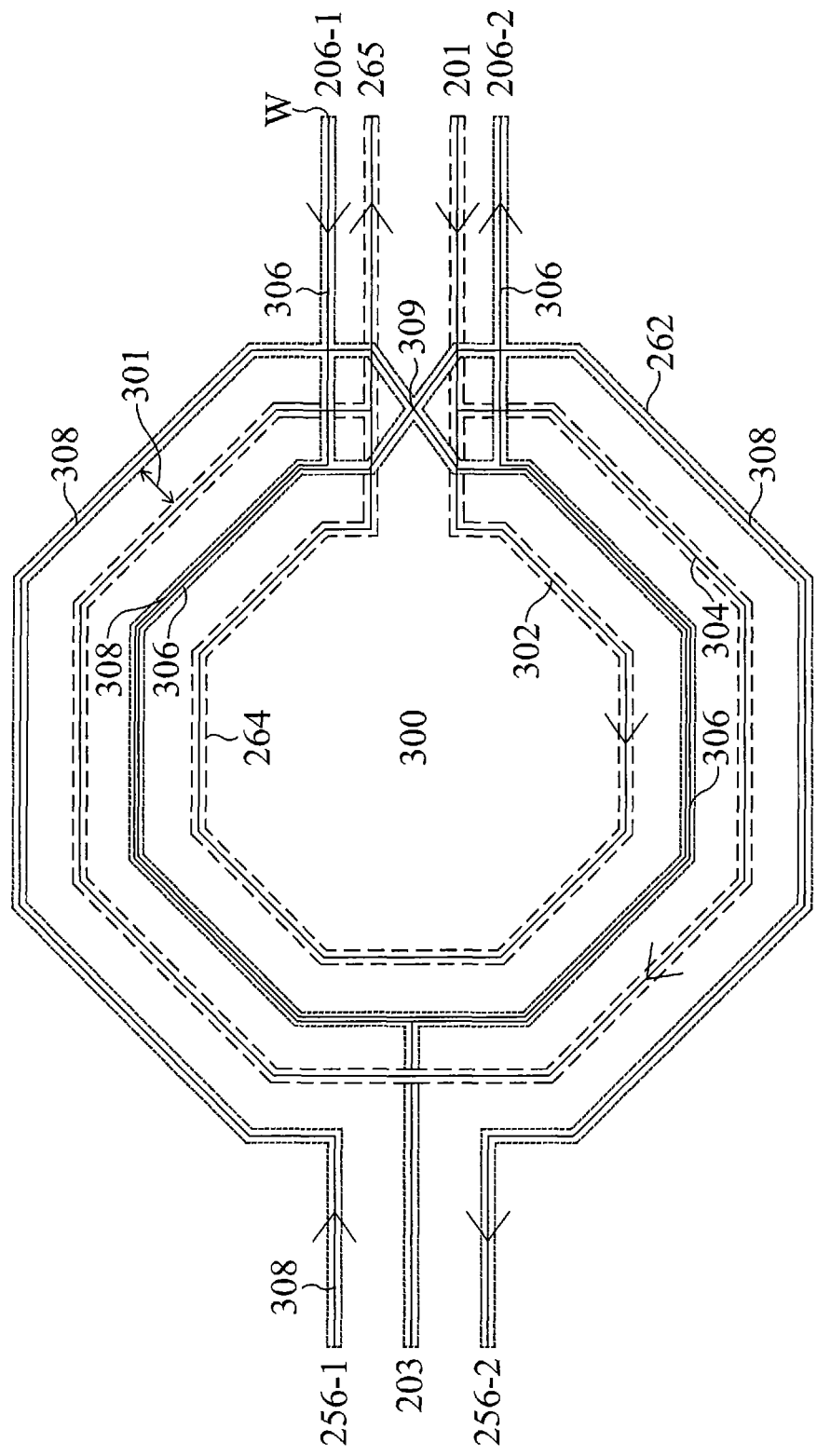
FIG. 3A illustrates an exemplary layout design of the transformer circuit of FIG. 2A, in accordance with some embodiments.
Figure 3B:
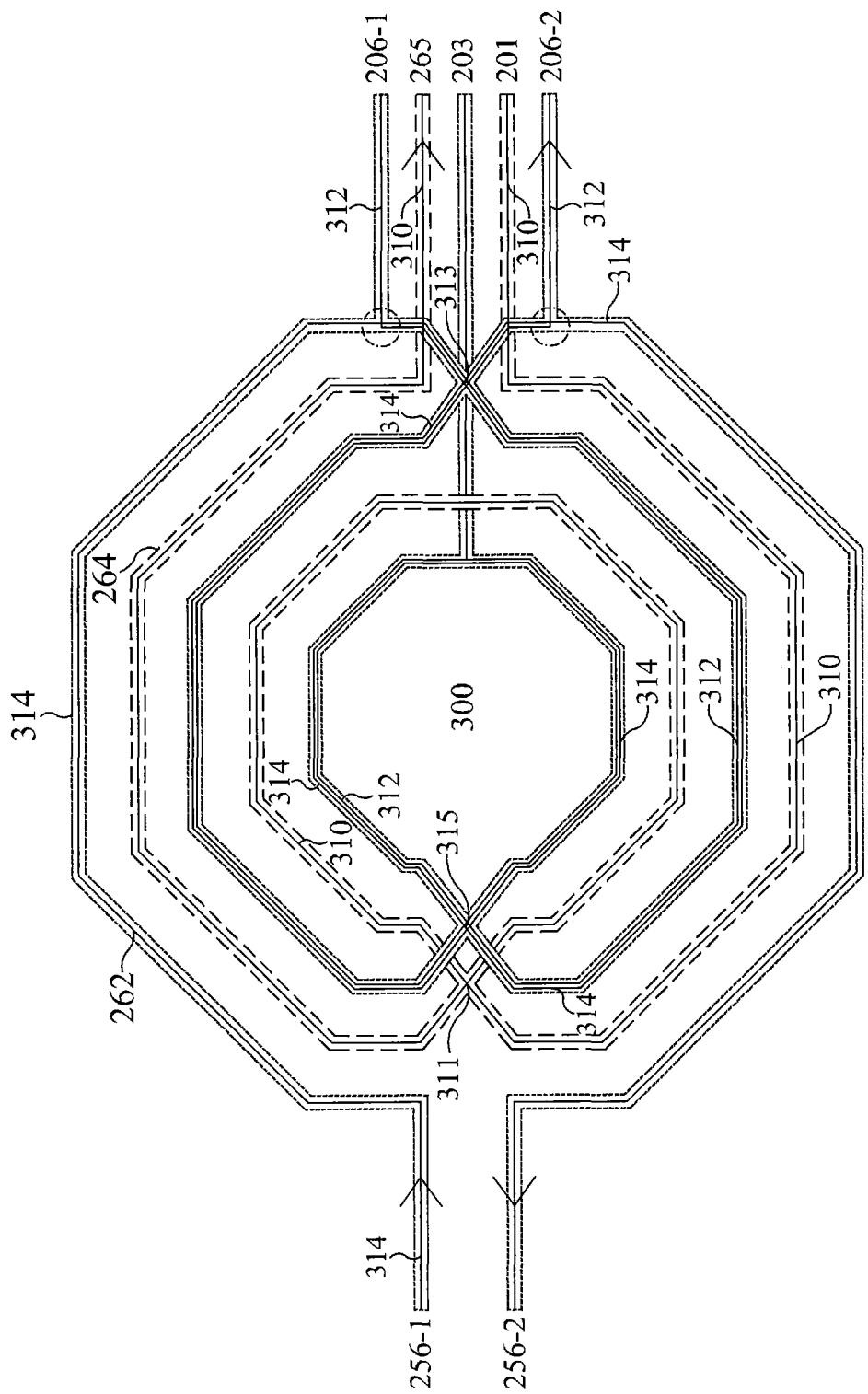
FIG. 3B illustrates another exemplary layout design of the transformer circuit of FIG. 2A, in accordance with some embodiments.
Figure 3C:
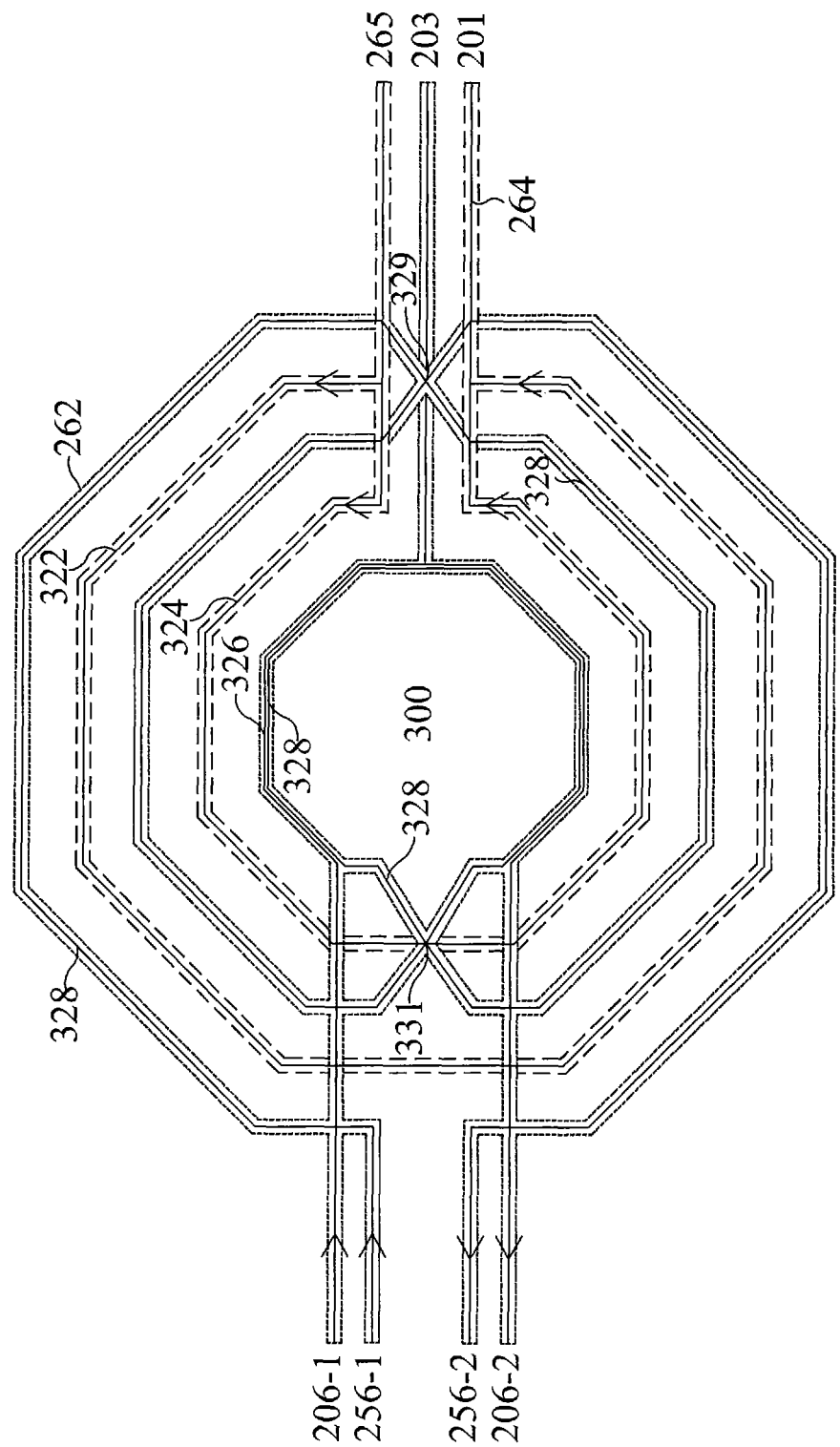
FIG. 3C illustrates yet another exemplary layout design of the transformer circuit of FIG. 2A, in accordance with some embodiments.

As will be further described with respect to FIGS. 3A, 3B, and 3C, the transformer circuit 106 includes at least two conductive coils that are physically interleaved with one another and operatively interact with each other. More specifically, the two conductive coils of the transformer circuit 106 are configured to electromagnetically couple with each other when at least one of the conductive coils is provided a signal (e.g., a current or a voltage signal). In some embodiments, a first conductive coil is coupled to the amplifier circuit 104, and a second conductive coil is coupled to the antenna 108. In particular, the two conductive coils each includes a respective number of turns of conductive lines/loops, i.e., the first conductive coil includes a first number of turns and the second conductive coil includes a second number of turns. In some embodiments, the transformer circuit 106 uses a turn ratio, i.e., a ratio of the first number of turns to the second number of turns, to match the impedances 107 and 109. More specifically, the square of the turn ratio equals a ratio of the impedance 107 to the impedance 109.

In general, an impedance value of 107 determines a variety of performance characteristics of the wireless transmitter 100. For example, when the wireless transmitter 100 is intended to be used in BT applications, a lower impedance value of 107 may be used so as to achieve a higher output transmission power and a higher linearity. When the wireless transmitter 100 is intended to be used in BLE applications, a higher impedance value of 107 may be used so as to achieve a higher power conversion efficiency and a lower output transmission power.

In accordance with various embodiments of the present disclosure, the transformer circuit 106 is implemented as a switchable transformer that provides a switchable turn ratio. As described above, the impedance value of 109 is typically selected to be about 50$\Omega$. Accordingly, when the turn ratio is switched to a lower value, the impedance 107 presents a lower impedance value because of the lower turn ratio; and when the turn ratio is switched to a higher value, the impedance 107 presents a higher impedance value because of the higher turn ratio. Moreover, in some embodiments, the transformer circuit 106 provides at least two pairs of ports that correspond to the higher and lower values of turn ratio, respectively, hereinafter "higher ports" and "lower ports." More specifically, when the wireless transmitter 100 is intended to be used in BT applications, a first pair of sub-amplifier circuits is activated and coupled to the lower ports. And when the wireless transmitter 100 is intended to be used in BLE applications, a second pair of sub-amplifier circuits is activated and coupled to the higher ports. The first and second pairs of sub-amplifier circuits will be described in further detail below with respect to FIG. 2A.

Figure 2A:
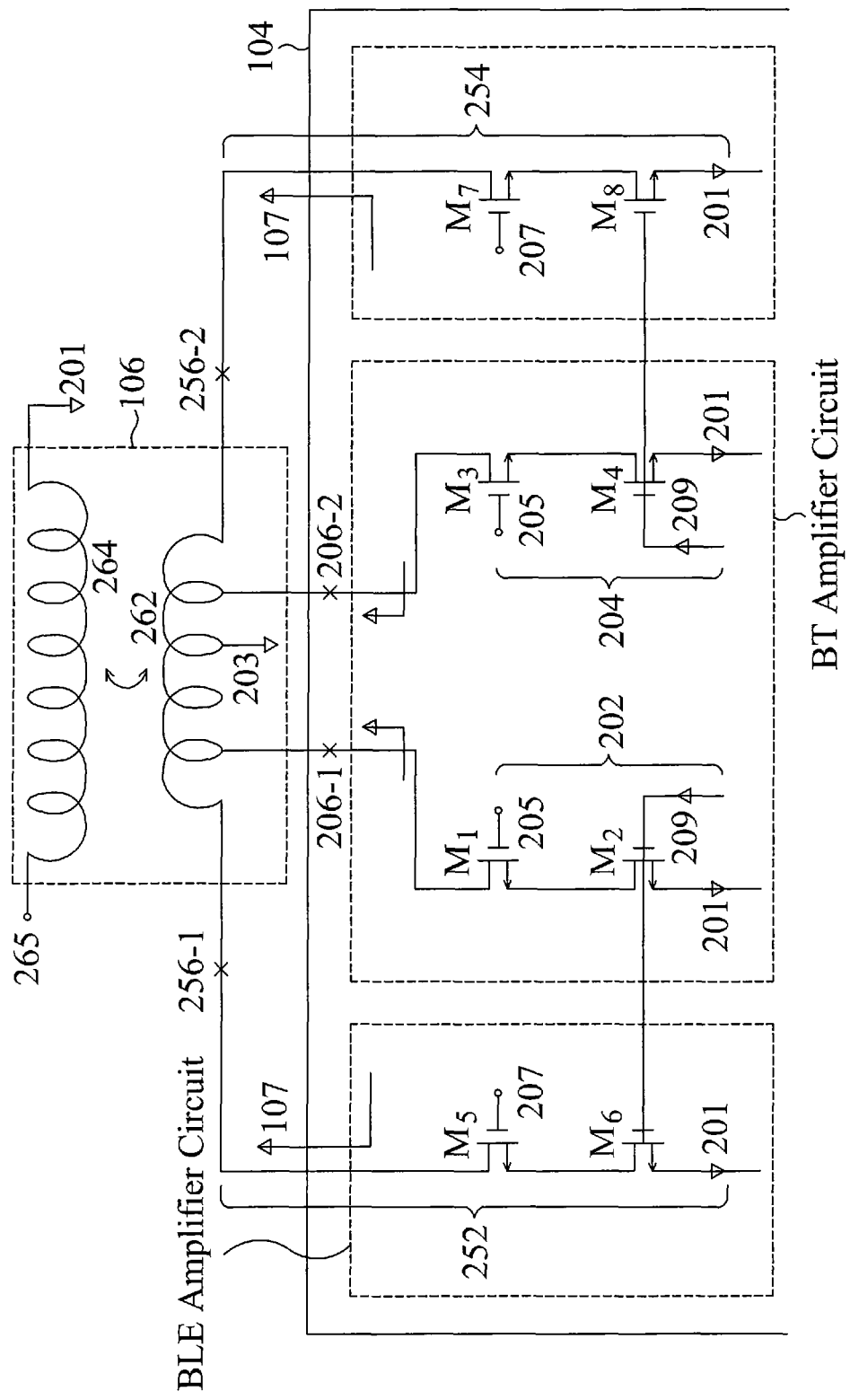
FIG. 2A illustrates an exemplary circuit diagram of an amplifier circuit and a transformer circuit of the wireless transmitter of FIG. 1, in accordance with some embodiments.

FIG. 2A illustrates an exemplary circuit diagram of the amplifier circuit 104 and the transformer circuit 106, in accordance with various embodiments. As shown, the amplifier circuit 104 includes a first pair of sub-amplifier circuits 202 and 204, and a second pair of sub-amplifier circuits 252 and 254. Each of the first and second pairs of sub-amplifier circuits is configured to receive the above-mentioned processed data (e.g., 209) from the data processing circuit 102, and further amplify the processed data to the coupled transformer circuit 106. In the illustrated embodiment of FIG. 2A, a schematic circuit diagram of the transformer circuit 106 includes a first conductive coil 262 and a second conductive coil 264 that is electromagnetically coupled to the first conductive coil 262. Various exemplary layout designs of the first conductive coil 262 and the second conductive coil 264 will be illustrated and discussed in further detail below with respect to FIGS. 3A, 3B, and 3C.

As shown in FIG. 2A, the first pair of sub-amplifier circuits 202 and 204 each includes two serially coupled transistors, and the second pair of sub-amplifier circuits 252 and 254 each includes two serially coupled transistors. In some embodiments, each of the transistors is implemented as an n-type metal-oxide-semiconductor field-effect-transistor (N-MOSFET). However, each of the transistors may be implemented by any of a variety of transistors that are suitable to be used in a power amplifier such as, for example, a p-type metal-oxide-semiconductor field-effect-transistor (P-MOSFET), a bipolar junction transistor (BJT), a high-electron mobility transistor (HEMT), etc., while remaining within the scope of the present disclosure.

In some embodiments, the sub-amplifier circuit 202 includes transistors $M_1$ and $M_2$ that are coupled to each other in series; the sub-amplifier circuit 204 includes transistors $M_3$ and $M_4$ that are coupled to each other in series. In some embodiments, transistors $M_1$ and $M_3$ are each coupled to the first conductive coil 262 of the transformer circuit 106 via respective drain ends. More specifically, the drain ends of the transistors $M_1$ and $M_3$ are coupled to the first conductive coil 262 via the above-mentioned "lower ports," 206-1 and 206-2, which will be discussed in further detail below with respect to FIGS. 3A-3C. The gates of the transistors $M_1$ and $M_3$ are each coupled to a control signal 205. Source ends of the transistors $M_1$ and $M_3$ are each coupled to drain ends of transistors $M_2$ and $M_4$. The gates of the transistors $M_2$ and $M_4$ are each coupled to the output of the data processing circuit 102 and configured to receive the processed data (e.g., 209). Source ends of the transistors $M_2$ and $M_4$ are each coupled to a supplied voltage 201 (e.g., ground).

In some embodiments, the sub-amplifier circuit 252 includes transistor $M_5$ and $M_6$ that are coupled to each other in series; the sub-amplifier circuit 254 includes transistor $M_7$ and $M_8$ that are coupled to each other in series. In some embodiments, transistors $M_5$ and $M_7$ are each coupled to the first conductive coil 262 of the transformer circuit 106 via respective drain ends. More specifically, the drain ends of the transistors $M_5$ and $M_7$ are coupled to the first conductive coil 262 via the above-mentioned "higher ports," 256-1 and 256-2, which will be discussed in further detail below with respect to FIGS. 3A-3C. The gates of the transistors $M_5$ and $M_7$ are each coupled to a control signal 207. Source ends of the transistors $M_5$ and $M_7$ are each coupled to drain ends of transistors $M_6$ and $M_8$. Similar to the transistors $M_2$ and $M_4$, the gates of the transistors $M_6$ and $M_8$ are also each coupled to the output of the data processing circuit 102 and configured to receive the processed data (e.g., 209). Source ends of the transistors $M_6$ and $M_8$ are each coupled to the supplied voltage 201 (e.g., ground).

In some embodiments, in each of the first pair (202 and 204) and second pair (252 and 254) of sub-amplifier circuits, the transistor directly coupled to the transformer circuit 106 and the transistor directly coupled to the data processing circuit 102 includes a respective gate oxide thickness so as to tolerate a different level of input voltage. For example, the transistors $M_1$, $M_3$, $M_5$, and $M_7$ each includes a thicker gate oxide so as to allow the respective input voltage (e.g., 205 and 207) to be about 1.8±10% V, and the transistors $M_2$, $M_4$, $M_6$, and $M_8$ each includes a thinner gate oxide thickness so as to allow the respective input voltage (e.g., 209) to be about 0.8±10% V.

In some embodiments, the control signals 205 and 207 are complementarily asserted such that the first pair of sub-amplifier circuits (202 and 204) and the second pair of sub-amplifier circuits (252 and 254) are complementarily turned on/activated. When the first pair of sub-amplifier circuits (202 and 204) are activated, the first pair of sub-amplifier circuits (202 and 204) are configured to amplify the processed data 209, received from the data processing circuit 102, to a first desired output power. When the second pair of sub-amplifier circuits (252 and 254) are activated, the second pair of sub-amplifier circuits (252 and 254) are configured to amplify the processed data 209, received from the data processing circuit 102, to a second desired output power. In some embodiments, the first output power (e.g., about 10~15 dBm) is substantially higher than the second output power (e.g., about 1~3 dBm), which allows the first pair of sub-amplifier circuits (202 and 204) to be more suitable for BT applications, and the second pair of sub-amplifier circuits (252 and 254) to be more suitable for BLE applications. Accordingly, the first pair of sub-amplifier circuits (202 and 204) are referred to as a "BT amplifier circuit," and the second pair of sub-amplifier circuits (252 and 254) are referred to as a "BLE amplifier circuit," hereinafter.

Although in the illustrated embodiment of FIG. 2A, the sub-amplifier circuits 202 and 204 (i.e., the BT amplifier circuit) each includes a single transistor ($M_1$ and $M_3$) coupled to the transformer circuit 106 and a single transistor ($M_2$ and $M_4$) coupled to the data processing unit 102, respectively, in some other embodiments of the present disclosure, the BT amplifier circuit may include a first plurality of pairs of transistors coupled to the transformer circuit 106 and a second plurality of pairs of transistors coupled to the data processing circuit 102, wherein the numbers of the first and second pluralities of pairs may be equal or different.

Figure 2B:
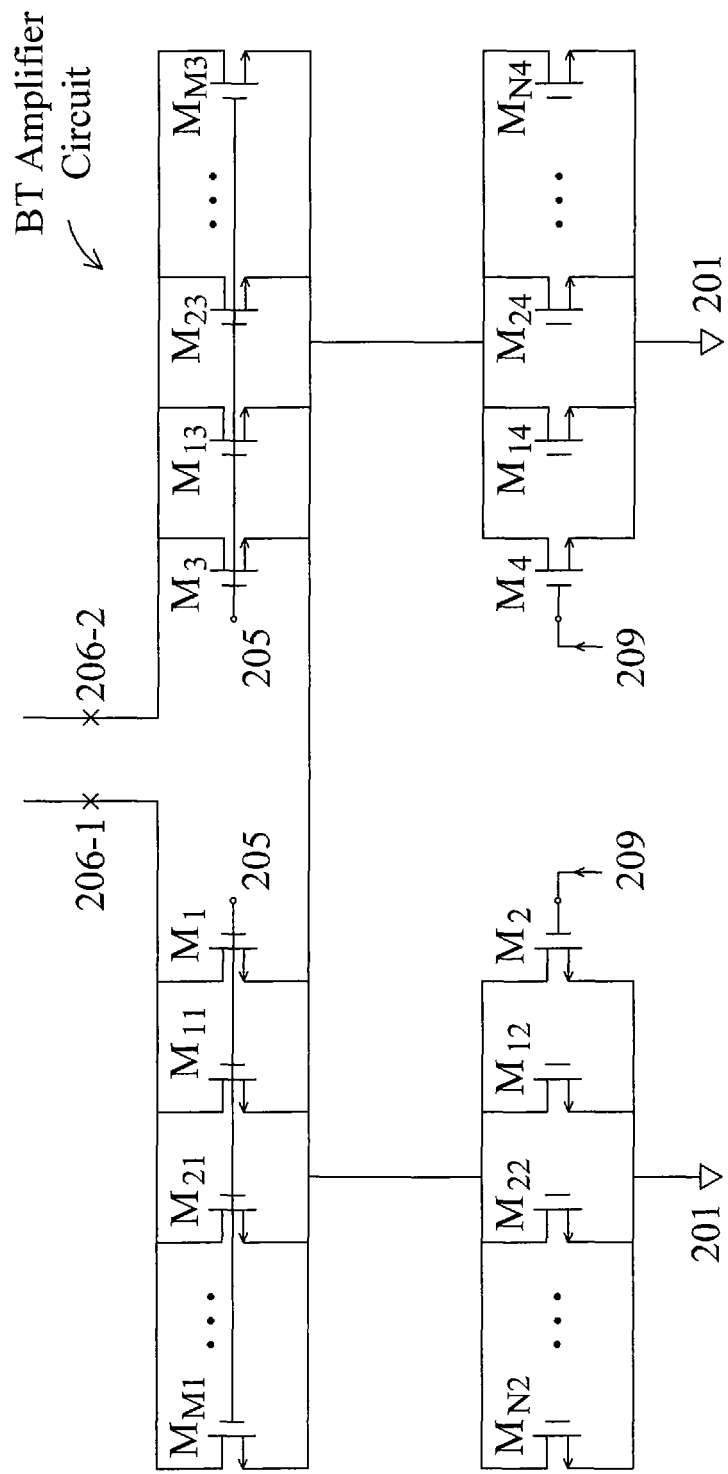
FIG. 2B illustrates another exemplary circuit diagram of part of the amplifier circuit of FIG. 2A, in accordance with some embodiments.

Referring now to FIG. 2B, as shown, in addition to the first pair of transistors ($M_1$ and $M_3$), the BT amplifier circuit 200 further includes one or more pairs of transistors coupled to the transformer circuit 106, for example, ($M_{11}$ and $M_{13}$), ($M_{21}$ and $M_{23}$), and up to ($M_{M1}$ and $M_{M3}$), wherein the subscript "M" is an integer that equals the number of the first plurality of pairs. Similarly, in addition to the first pair of transistors ($M_2$ and $M_4$), the BT amplifier circuit 200 further includes one or more pairs of transistors coupled to the data processing circuit 102, for example, ($M_{12}$ and $M_{14}$), ($M_{22}$ and $M_{24}$), and up to ($M_{N2}$ and $M_{N4}$), wherein the subscript "N" is an integer that equals the number of the second plurality of pairs. In some embodiments, M is about 200~300, and N is about 30~90. Similarly, in addition to first and second pairs of transistors ($M_5$ and $M_7$) and ($M_6$ and $M_8$) coupled to the transformer circuit 106 and the data processing circuit 102, respectively, the BLE amplifier circuit may include a first plurality of pairs of transistors coupled to the transformer circuit 106 and a second plurality of pairs of transistors coupled to the data processing circuit 102, wherein the numbers of the first and second pluralities of pairs (herein "O" and "P") may be equal or different. In some embodiments, O is about 50~70, and P is about 30~50. Because of being substantially similar to the illustrated embodiment of FIG. 2B, for clarity, an illustrated embodiment of the BLE amplifier that include "O" pairs of transistors coupled to the transformer circuit 106 and "P" pairs of transistors coupled to the data processing circuit 102 is omitted.

Referring back to FIG. 2A, in some embodiments, in addition to the lower ports (206-1 and 206-2) and higher ports (256-1 and 256-2), the transformer circuit 106 further includes tap port 203, and differential output ports 201 and 265. The tap port 203 is coupled to supplied voltage 203, e.g., Vdd, the differential output ports 201 and 265 are each coupled to the supplied voltage 201 (e.g., ground) and the antenna 108, respectively.

FIGS. 3A, 3B, and 3C each illustrates an exemplary layout design of the first and second conductive coils 262 and 264 of the transformer circuit 106, in accordance with various embodiments. Each conductive coil (e.g., 262 and 264) in the illustrated embodiments of FIGS. 3A-3C is formed as one or more routing lines, with a width "W" about 1~10 μm, in one or more loops, or coils, having conductive turns, wherein each loop is formed as an octagonal shape, hereinafter an "octagon-shaped loop." However, each loop may be formed as any of a variety of shapes such as, for example, a rectangular shape, a circular shape, a hexagonal shape, etc. In some embodiments, the first and second conductive coils 262 and 264 are interleaved with each other and share a common lumen (e.g., 300). The term "lumen" used herein may be referred to as an hollow area on an integrated circuit where the first and second conductive coils 262 and 264 are formed. In other words, the respective one or more "octagon-shaped" loops of the conductive coils 262 and 264 are overlapped to each other with a spacing (e.g., 301), which is about 2 μm, in accordance with some embodiments. In some embodiments, each conductive coil is formed of a metal material and/or a polycrystalline (e.g., silicon) material. It is understood, however, that other conductive materials may be utilized in accordance with various embodiments. Additionally or alternatively, each conductive coil may be formed as terminal connections that are overlaid in part by routing a conductive material (e.g., a metal material and/or a polycrystalline silicon material) in a loop and/or up or down through plural integrated circuit layers.

In some embodiments, the transformer circuit 106 (FIG. 2A) is implemented as a 7-port transformer, as shown in FIG. 3A. More specifically, the transformer circuit 106 includes 7 ports: 201, 203, 206-1, 206-2, 256-1, 256-2, and 265, as described above. According to some embodiments, the differential output port 201 is coupled to ground; the tap port 203 is coupled to Vdd; the differential output port 265 serves as the output of the transformer circuit 106 and is coupled to the antenna 108; the ports 206-1 and 206-2 are the "lower ports" configured to couple the BT amplifier circuit (202, 204, etc.) to the transformer circuit 106; the ports 256-1 and 256-2 are the "higher ports" configured to couple the BLE amplifier circuit (252, 254, etc.) to the transformer circuit 106.

More particularly, in some embodiments, each conductive coil includes one or more turns. The term "turn" of a conductive coil, as used herein, is defined by a number of loops by which a (current) signal sequentially flows through the conductive coil. For example, as shown in the exemplary layout design with respect to FIG. 3A, when a current signal is applied to the conductive coil 264 via the port 201, the current signal may flow from the port 201, concurrently through paths 302 (an inner loop of the conductive coil 264) and 304 (an outer loop of the conductive coil 264), respectively, to the port 265. Effectively, the current signal sequentially flows through the conductive coil 264 by one loop because the current signal only sequentially flows through the conductive coil 264 by one loop. Accordingly, the conductive coil 264 has one turn while the respective ports 201 and 265 are provided with a signal (e.g., a current signal). On the other hand, when a current signal is applied to the conductive coil 262 via the port 206-1, the current signal may flow from the port 206-1, through path 306 (an inner loop of the conductive coil 262), to the port 206-2. As such, the current signal flows from the port 206-1, through part of the conductive coil 262, and to the port 206-2 by one loop, and accordingly, the conductive coil 262 has one turn while the ports 206-1 and 206-2 are provided with a current signal. When a current signal is applied to the conductive coil 262 via the port 256-1, the current signal may flow from the port 256-1, through path 308, to the port 206-2. More specifically, as shown, the path 308 first starts at the port 256-1, extends along an outer and upper part of the conductive coil 262, across point 309, along the inner loop of the conductive coil 262, across again the point 309, and along an outer and lower part of the conductive coil 262, and ends at the port 256-2. As such, the current signal flows from the port 256-1, through the conductive coil 262, and to the port 256-2 by two loops, and accordingly, the conductive coil 262 has two turns while the ports 256-1 and 256-2 are provided with a current signal.

FIG. 3B illustrates another exemplary layout design of the first and second conductive coils 262 and 264 of the transformer circuit 106, in accordance with various embodiments. A shown, when a current signal is applied to the conductive coil 264 via the port 201, the current signal flows from the port 201, through path 310, to the port 265. More specifically, the path 310 starts from the port 201, extends along an outer and lower part of the conductive coil 264, across point 311, along an inner and upper part of the conductive coil 264 then an inner and lower part of the conductive coil 264, again across the point 311, further along an outer and upper part of the conductive coil 264, and ends at the port 265. As such, the current signal flows from the port 201, through the conductive coil 264, and to the port 265 by two loops, and accordingly, the conductive coil 264 has two turns while the respective ports 201 and 265 are provided with a current signal.

Referring still to FIG. 3B, when a current signal is applied to the conductive coil 262 via the port 206-1, the current signal may flow from the port 206-1, through path 312, to the port 206-2. More specifically, the path 312 starts from the port 206-1, extends across point 313, along a middle and lower part of the conductive coil 262, across point 315, along an inner and upper part of the conductive coil 262 then an inner and lower part of the conductive coil 262, again across the point 315, further along a middle and upper part of the conductive coil 262, and ends at the port 206-2. As such, the current signal flows from the port 206-1, through part of the conductive coil 262, and to the port 206-2 by two loops, and accordingly, the conductive coil 262 has two turns while the ports 206-1 and 206-2 are provided with a current signal. When a current signal is applied to the conductive coil 262 via the port 256-1, the current signal may flow from the port 256-1, through path 314 to the port 206-2. More specifically, the path 314 starts from the port 256-1, extends along an outer and upper part of the conductive coil 262, across the point 313, along the middle and lower part of the conductive coil 262, across point 315, along the inner and upper part and then the inner and lower part of the conductive coil 262, again across the point 315, along the middle and upper part of the conductive coil 262, again across the point 313, further along an outer and lower part of the conductive coil 262, and ends at the port 256-2. As such, the current signal flows from the port 256-1, through the conductive coil 262, and to the port 256-2 by three loops, and accordingly, the conductive coil 262 has three turns while the ports 256-1 and 256-2 are provided with a current signal.

FIG. 3C illustrates yet another exemplary layout design of the first and second conductive coils 262 and 264 of the transformer circuit 106, in accordance with various embodiments. A shown, when a current signal is applied to the conductive coil 264 via the port 201, the current signal may flow from the port 265, concurrently through paths 322 (an outer loop of the conductive coil 264) and 324 (an inner loop of the conductive coil 264), respectively, to the port 201. Effectively, the current signal sequentially flows through the conductive coil 264 by one loop. Accordingly, the conductive coil 264 has one turn while the respective ports 201 and 265 are provided with a current signal. Further, when a current signal is applied to the conductive coil 262 via the port 206-1, the current signal may flow from the port 206-1, through path 326, to the port 206-2. More specifically, the path 326 starts from the port 206-1, extends along an inner loop of the conductive coil 262, and ends at the port 206-2. As such, the current signal flows from the port 206-1, through part of the conductive coil 262, and to the port 206-2 by one loop, and accordingly, the conductive coil 262 has one turn while the ports 206-1 and 206-2 are provided with a current signal. When a current signal is applied to the conductive coil 262 via the port 256-1, the current signal may flow from the port 256-1, through path 328, to the port 206-2. More specifically, the path 328 starts from the port 256-1, extends along an outer and upper part of the conductive coil 262, across point 329, along a middle and lower part of the conductive coil 262, across point 331, along the inner loop of the conductive coil 262, again across the point 331, along a middle and upper part of the conductive coil 262, again across the point 329, further along an outer and lower part of the conductive coil 262, and ends at the port 256-2. As such, the current signal flows from the port 256-1, through the conductive coil 262, and to the port 256-2 by three loops, and accordingly, the conductive coil 262 has three turns while the ports 256-1 and 256-2 are provided with a current signal.

As described above, in some embodiments, when the wireless transmitter 100 (FIGS. 1 and 2) is intended to be used in BT applications (requiring high linearity), the first pair of sub-amplifier circuits (202 and 204), i.e., the BT amplifier circuit, is activated and coupled to the transformer circuit 106 via the lower ports 206-1 and 206-2. Accordingly, the above-mentioned turn ratio, i.e., the ratio of the number of turns of the first conductive coil 262 to the number of turns of the second conductive coil 264, is switched to a lower value, which provides a lower impedance value of 107 given a fixed impedance value of 109, and thus causes the wireless transmitter 100 to be more suitable to provide an output signal with a high linearity. When the wireless transmitter 100 is intended to be used in BLE applications (requiring high power efficiency), the second pair of sub-amplifier circuits (252 and 254), i.e., the BLE amplifier circuit, is activated and coupled to the transformer circuit 106 via the higher ports 256-1 and 256-2. Accordingly, the above-mentioned turn ratio is switched to a higher value, which provides a higher impedance value of 107 given a fixed impedance value of 109, and thus causes the wireless transmitter 100 to be more suitable to provide an output signal with a high power efficiency.

Using the layout design of transformer circuit 106 of FIG. 3A as an example, when the BT amplifier circuit is coupled to the transformer circuit 106 via the ports 206-1 and 206-2, the turn ratio becomes 1 because of the one turn of the conductive coil 264 and the one turn of the conductive coil 262 while ports 206-1 and 206-2 are coupled to a signal provided by the BT amplifier circuit, as described above with respect to FIG. 3A. Similarly, when the BLE amplifier circuit is coupled to the transformer circuit 106 via the ports 256-1 and 256-2, the turn ratio becomes 3 because of the one turn of the conductive coil 264 and the three turns of the conductive coil 262 while ports 256-1 and 256-2 are coupled to a signal provided by the BLE amplifier circuit, as described above with respect to FIG. 3A.

Using the layout design of transformer circuit 106 of FIG. 3B as another example, when the BT amplifier circuit is coupled to the transformer circuit 106 via the ports 206-1 and 206-2, the turn ratio becomes 1 (2/2) because of the two turns of the conductive coil 264 and the two turns of the conductive coil 262 while ports 206-1 and 206-2 are coupled to a signal provided by the BT amplifier circuit, as described in FIG. 3B; when the BLE amplifier circuit is coupled to the transformer circuit 106 via the ports 256-1 and 256-2, the turn ratio becomes 1.5 (3/2) because of the two turn of the conductive coil 264 and the three turns of the conductive coil 262 while ports 256-1 and 256-2 are coupled to a signal provided by the BLE amplifier circuit, as described in FIG. 3B.

Using the layout design of transformer circuit 106 of FIG. 3C as yet another example, when the BT amplifier circuit is coupled to the transformer circuit 106 via the ports 206-1 and 206-2, the turn ratio becomes 1 because of the one turn of the conductive coil 264 and the one turn of the conductive coil 262 while ports 206-1 and 206-2 are coupled to a signal provided by the BT amplifier circuit, as described in FIG. 3C; when the BLE amplifier circuit is coupled to the transformer circuit 106 via the ports 256-1 and 256-2, the turn ratio becomes 3 because of the one turn of the conductive coil 264 and the three turns of the conductive coil 262 while ports 256-1 and 256-2 are coupled to a signal provided by the BLE amplifier circuit, as described in FIG. 3C.

In an embodiment, a wireless transmitter is disclosed. The wireless transmitter includes a an amplifier; and a switchable transformer, coupled to the amplifier, wherein the amplifier is configured to be coupled to the switchable transformer in first and second configurations, wherein the first configuration causes the amplifier to provide a first output impedance to the switchable transformer, and wherein the second configuration causes the amplifier to provide a second output impedance to the switchable transformer, the first and second output impedances being different from each other.

In another embodiment, a wireless transmitter includes an amplifier; and a switchable transformer, coupled to the amplifier, wherein the amplifier is configured to be coupled to the switchable transformer in first and second configurations, wherein the first configuration causes the amplifier to provide a first output impedance to the switchable transformer, and wherein the second configuration causes the amplifier to provide a second output impedance to the switchable transformer, and wherein the second output impedance is substantially higher than the first output impedance.

Yet in another embodiment, a wireless transmitter includes an amplifier circuit comprising: a first pair of sub-amplifier circuits; and a second pair of sub-amplifier circuits; and a switchable transformer, coupled to the first and second pairs of sub-amplifier circuits, wherein the first and second pairs of sub-amplifier circuits are complementarily activated, wherein when the first pair of sub-amplifier circuits is activated, a first output impedance to the switchable transformer is formed, and when the second pair of sub-amplifier circuits is activated, a second output impedance to the switchable transformer is formed, and wherein the second output impedance is substantially higher than the first output impedance.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wireless transmitter, comprising:
   an amplifier; and
   a switchable transformer, coupled to the amplifier,
   wherein the amplifier is configured to be coupled to the switchable transformer in first and second configurations, wherein the first configuration causes the amplifier to provide a first output impedance to the switchable transformer, and wherein the second configuration causes the amplifier to provide a second output impedance to the switchable transformer, the first and second output impedances being different from each other, wherein the amplifier comprises M transistors connected in parallel to one another and directly coupled to the switchable transformer, wherein M is an even integer greater than 2, and N transistors connected in parallel to one another and directly coupled to a circuit, wherein N is an even integer greater than 2, and
   wherein the switchable transformer comprises a first conductive coil and a second conductive coil that are interleaved with each other.

2. The wireless transmitter of claim 1, wherein M transistors are directly coupled to only two ports of the switchable transformer.

3. The wireless transmitter of claim 1, wherein the second conductive coil is coupled to an output antenna of the wireless transmitter.

4. The wireless transmitter of claim 1, wherein when the amplifier is coupled to the switchable transformer in the first configuration, a first pair of sub-amplifier circuits of the amplifier is activated and coupled to the first conductive coil so that a first ratio defined as a first number of turns of the first conductive coil to a number of turns of the second conductive coil is formed.

5. The wireless transmitter of claim 4, wherein when the amplifier is coupled to the switchable transformer in the second configuration, a second pair of sub-amplifier circuits of the amplifier is activated and coupled to the first conductive coil so that a second ratio defined as a second number of turns of the first conductive coil to the number of turns of the second conductive coil is formed.

6. The wireless transmitter of claim 5, wherein the first and second pairs of sub-amplifier circuits are complementarily activated so as to cause the first and second output impedances to be formed complementarily.

7. The wireless transmitter of claim 5, wherein the second ratio is substantially higher than the first ratio.

8. The wireless transmitter of claim 7, wherein the first and second ratios define the first and second output impedances, respectively.

9. The wireless transmitter of claim 8, wherein the second output impedance is substantially higher than the first output impedance.

10. The wireless transmitter of claim 1, wherein the second output impedance is substantially higher than the first output impedance so that when the amplifier is coupled to the switchable transformer in the first configuration, the wireless transmitter is configured to be used in Bluetooth (BT) applications, and when the amplifier is coupled to the switchable transformer in the second configuration, the wireless transmitter is configured to be used in Bluetooth Low Energy (BLE) applications.

11. A wireless transmitter, comprising:
an amplifier; and
a switchable transformer, coupled to the amplifier,
wherein the amplifier is configured to be coupled to the switchable transformer in first and second configurations, wherein the first configuration causes the amplifier to provide a first output impedance to the switchable transformer, and wherein the second configuration causes the amplifier to provide a second output impedance to the switchable transformer, and wherein the second output impedance is substantially higher than the first output impedance, wherein the amplifier comprises M transistors connected in parallel to one another and directly coupled to the switchable transformer, wherein M is an even integer greater than 2, and N transistors connected in parallel to one another and directly coupled to a circuit, wherein N is an even integer greater than 2,
wherein the M transistors each comprises a first gate oxide having a first thickness and the N transistors each comprises a second gate oxide having a second thickness that is smaller than the first thickness, and
wherein the switchable transformer comprises a first conductive coil and a second conductive coil that are interleaved with each other.

12. The wireless transmitter of claim 11, wherein the M transistors are directly coupled to only two ports of the switchable transformer.

13. The wireless transmitter of claim 11, wherein when the amplifier is coupled to the switchable transformer in the first configuration, a first pair of sub-amplifier circuits is activated and coupled to the first conductive coil so that a first ratio defined as a number of turns of part of the first conductive coil to a number of turns of the second conductive coil is formed.

14. The wireless transmitter of claim 13, wherein when the amplifier is coupled to the switchable transformer in the second configuration, a second pair of sub-amplifier circuits is activated and coupled to the first conductive coil so that a second ratio defined as a number of turns of the first conductive coil to the number of turns of the second conductive coil is formed, the second ratio being substantially higher than the first ratio.

15. The wireless transmitter of claim 14, wherein the first and second ratios define the first and second output impedances, respectively.

16. The wireless transmitter of claim 11, wherein when the amplifier is coupled to the switchable transformer in the first configuration, the wireless transmitter is configured to be used in Bluetooth (BT) applications, and when the amplifier is coupled to the switchable transformer in the second configuration, the wireless transmitter is configured to be used in Bluetooth Low Energy (BLE) applications.

17. The wireless transmitter of claim 11, wherein the amplifier is coupled to the switchable transformer in the first and second configurations complementarily.

18. A wireless transmitter, comprising:
an amplifier circuit comprising:
a first pair of sub-amplifier circuits; and
a second pair of sub-amplifier circuits; and
a switchable transformer, coupled to the first and second pairs of sub-amplifier circuits,
wherein the first and second pairs of sub-amplifier circuits are complementarily activated, wherein when the first pair of sub-amplifier circuits is activated, a first output impedance to the switchable transformer is formed, and when the second pair of sub-amplifier circuits is activated, a second output impedance to the switchable transformer is formed, and wherein the second output impedance is substantially higher than the first output impedance;
wherein the first pair of sub-amplifier circuits each comprises M transistors connected in parallel to one another and directly coupled to the switchable transformer, wherein M is an even integer greater than 2, and N transistors connected in parallel to one another and directly coupled to a circuit, wherein N is an even integer greater than 2, wherein the M transistors each comprises a first gate oxide having a first thickness and the N transistors each comprises a second gate oxide having a second thickness that is smaller than the first thickness, and
wherein the second pair of sub-amplifier circuits each comprises a third transistor directly coupled to the switchable transformer and a fourth transistor directly coupled to the circuit, wherein the third transistor comprises a third gate oxide having a third thickness and the fourth transistor comprises a fourth gate oxide having a fourth thickness that is smaller than the third thickness.

19. The wireless transmitter of claim 18, wherein when the first pair of sub-amplifier circuits is activated, the wireless transmitter is configured to be used in Bluetooth (BT) applications, wherein when the second pair of sub-amplifier circuits is activated, the wireless transmitter is configured to be used in Bluetooth Low Energy (BLE) applications.

20. The wireless transmitter of claim 18, wherein the switchable transformer comprises a first conductive coil and a second conductive coil, and wherein when the first pair of sub-amplifier circuits is activated and coupled to the first conductive coil, a first ratio defined as a first number of turns of the first conductive coil to a number of turns of the second conductive coil is formed, and when the second pair of sub-amplifier circuits is activated and coupled to the first conductive coil, a second ratio defined as a second number of turns of the first conductive coil to the number of turns of the second conductive coil is formed, the second ratio being substantially higher than the first ratio.

* * * * *